United States Patent [19]

Nishimura

[11] Patent Number: 5,099,139
[45] Date of Patent: Mar. 24, 1992

[54] VOLTAGE-CURRENT CONVERTING CIRCUIT HAVING AN OUTPUT SWITCHING FUNCTION

[75] Inventor: Kouichi Nishimura, Tokyo, Japan
[73] Assignee: NEC Corporation, Tokyo, Japan
[21] Appl. No.: 528,953
[22] Filed: May 24, 1990
[30] Foreign Application Priority Data
 May 24, 1989 [JP] Japan .................. 1-132005
[51] Int. Cl.⁵ .................. H03K 3/023; H03K 5/00
[52] U.S. Cl. .................. 307/261; 307/253; 307/296.1; 307/359; 307/490
[58] Field of Search ........... 307/253, 254, 255, 359, 307/296.1, 261, 296.6, 490

[56] References Cited

U.S. PATENT DOCUMENTS

| | | | |
|---|---|---|---|
| 3,870,906 | 3/1975 | Hughes | 307/296.6 |
| 3,902,806 | 9/1975 | Bober | 307/296.6 |
| 4,302,726 | 11/1981 | Shobbrook | 307/296.6 |
| 4,550,262 | 10/1985 | Kohsiek | 307/296.6 |
| 4,864,216 | 9/1989 | Kalata et al. | 307/296.6 |
| 4,893,252 | 1/1990 | Blümel | 307/296.6 |

Primary Examiner—John Zazworsky
Attorney, Agent, or Firm—Helfgott & Karas

[57] ABSTRACT

A voltage-current converting circuit having an output switching function, comprises an operational amplifier having a non-inverting input connected to an input terminal, a resistor having one end connected to a reference potential line and the other end connected to an inverting input of the operational amplifier, first and second PNP transistors having commonly connected emitters connected to the inverting input of the operational amplifier, and an electronic switch for alternatively connecting an output of the operational amplifier to either a base of the first transistor or a base of the second transistor. With this arrangement, a current output is supplied from a collector of the transistor receiving the output of the operational amplifier through the electronic switch.

7 Claims, 2 Drawing Sheets

VOLTAGE-CURRENT CONVERTING CIRCUIT HAVING AN OUTPUT SWITCHING FUNCTION

BACKGROUND OF THE INVENTION

1. Field of the Invention

The present invention relates to a circuit for converting an electric voltage into an electric current, and more specifically to a current output circuit in a voltage-current converting circuit which uses an operational amplifier.

2. Description of Related Art

One typical example of conventional voltage-current converting circuits using an operational amplifier has been combined with a current switch. The voltage-current converting circuit includes an operational amplifier having a non-inverting input connected to receive an input voltage, a voltage-current converting transistor having a base connected to an output of the operational amplifier, and a pair of current switching transistors connected in series to the converting transistor, so that a current is outputted from a selected one of the pair of current switching transistors. With this arrangement, regardless of which of the pair of current switching transistors is selected, the output current flows in series through the voltage-current converting transistor and the selected one of the pair of current switching transistors. As result, the output current of the conventional voltage-current converting circuit is greatly influenced by a current amplification factor of the voltage-current converting transistor and a current amplification factor of the current switching transistors in the form of multiplication. Therefore, the conventional voltage-current converting circuit has a large error caused by variation of the current amplification factors. In order to depress the error caused by the current amplification factors, if each of the voltage-current converting transistor and the current switching transistors is put in the form of a Darlington connection, three transistors have to be added.

SUMMARY OF THE INVENTION

Accordingly, it is an object of the present invention to provide a voltage-current converting circuit which has overcome the above mentioned defect of the conventional one.

Another object of the present invention is to provide a voltage-current converting circuit having a current switching function, which circuit is composed of a small number of elements and has a high degree of conversion precision.

The above and other objects of the present invention are achieved in accordance with the present invention by a voltage-current converting circuit having an output switching function, comprising an operational amplifier having a non-inverting input connected to an input terminal, a resistor having one end connected to a reference potential line and the other end connected to an inverting input of the operational amplifier, first and second transistors of the same conduction type having commonly connected emitters connected to the inverting input of the operational amplifier, and an electronic switch for alternatively supplying an output of the operational amplifier to either a base of the first transistor or a base of the second transistor, so that a collector of the transistor receiving the output of the operational amplifier through the electronic switch supplies a current output.

The above and other objects, features and advantages of the present invention will be apparent from the following description of preferred embodiments of the invention with reference to the accompanying drawings.

DESCRIPTION OF THE PREFERRED EMBODIMENTS

Figure 1:
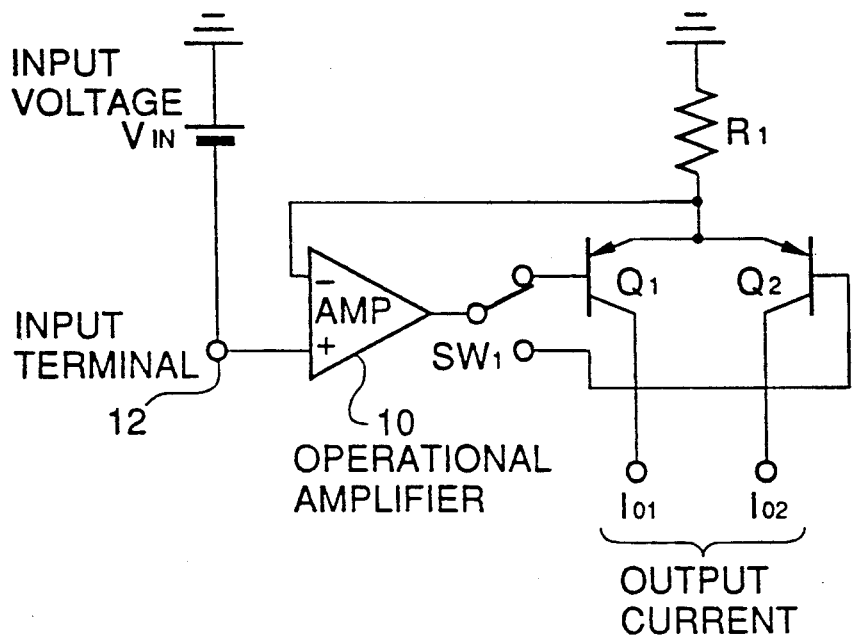
FIG. 1 is a circuit diagram of a basic construction of the voltage-current converting circuit in accordance with the present invention.

Referring to FIG. 1, there is shown a circuit diagram of a basic construction of the voltage-current converting circuit in accordance with the present invention.

The shown voltage-current converting circuit includes an operational amplifier 10 having a non-inverting input connected to an input terminal 12 to which an input voltage Vin is supplied. A resistor $R_1$ is connected between an inverting input of the operational amplifier 10 and a ground. The shown voltage-current converting circuit also includes a pair of PNP transistors $Q_1$ and $Q_2$ having commonly connected emitters connected to the resistor $R_1$ and the inverting input of the operational amplifier 10. An output of the operational amplifier is selectively connected through an electronic switch $SW_1$ to either a base of the PNP transistor $Q_1$ or a base of the PNP transistors $Q_2$. A collector of each of the PNP transistors $Q_1$ and $Q_2$ form a current output.

With the above mentioned arrangement, a current corresponding to a value obtained by dividing the input voltage Vin by a resistance R of the resistor $R_1$ is outputted from the collector of the PNP transistor $Q_1$ or the collector of the PNP transistor $Q_2$, in accordance with a position of the electronic switch $SW_1$. Regardless of which of the PNP transistors $Q_1$ and $Q_2$ is selected, an emitter-base of the selected transistor is put in a feedback loop constituted of the operational amplifier 10 and the selected transistor. Accordingly, if the voltage gain of the operational amplifier 10 is sufficiently sufficient large, the non-inverting input and the inverting input of the operational amplifier 10 will become a substantially equal potential to each other. Therefore, a current $I_R$ flowing through the resistor $R_1$ will take a value expressed as follows:

$$I_R = \frac{Vin}{R} \quad (1)$$

Therefore, assuming that an emitter grounded current amplification factor of each of the PNP transistors $Q_1$ and $Q_2$ is $\beta$, collector currents IO1 and IO2 of the PNP transistors $Q_1$ and $Q_2$, which form a final current output stage, can be expressed as follows.

$$IO1 = IO2 = \frac{Vin}{R} \cdot \frac{\beta}{1 + \beta} \quad (2)$$

Here, if the factor $\beta$ is sufficiently larger than 1, the equation (2) can be modified as follows:

$$I_{O1} = I_{O2} = \frac{V_{in}}{R} \qquad (3)$$

If influence of the factor $\beta$ in the equation (2) is a problem, each of the transistors $Q_1$ and $Q_2$ can be replaced by a Darlington structure or a field effect transistor.

Figure 2:
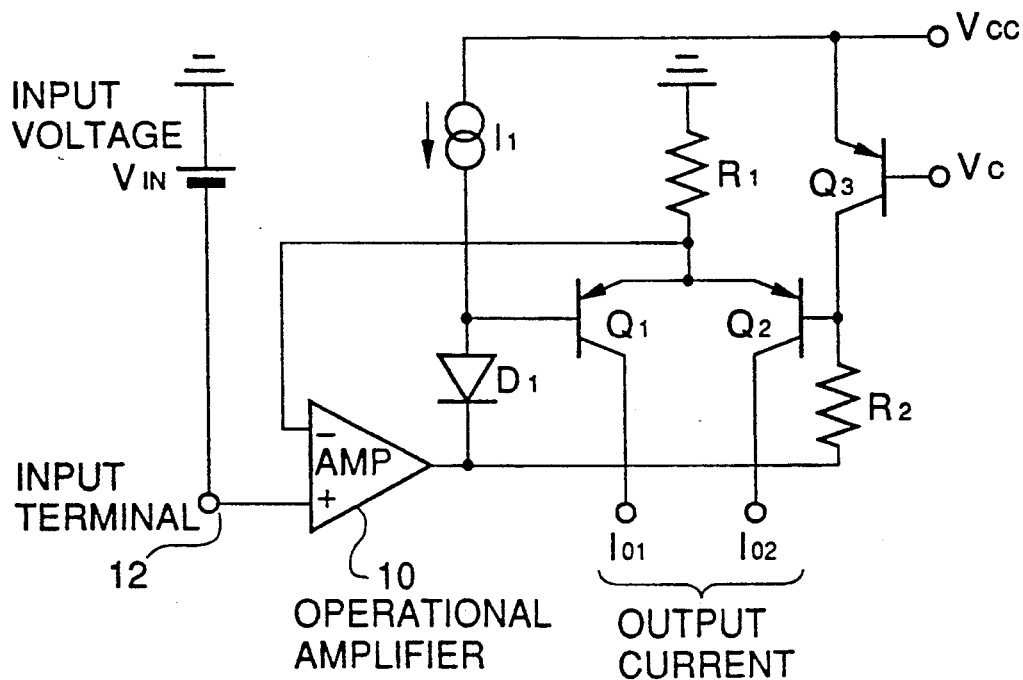
FIG. 2 is a circuit diagram of a first embodiment of the voltage-current converting circuit in accordance with the present invention.

Turning to FIG. 2, there is shown an embodiment of the voltage-current converting circuit in accordance with the present invention, in which the electronic switch $SW_1$ is composed of an actual electronic circuit. In FIG. 2, elements similar to those shown in FIG. 1 are given the same Reference Numerals and Letters, and explanation thereof will be omitted.

The switch $SW_1$ of the circuit shown in FIG. 1 is constituted of a constant current source $I_1$ having an input connected to a high voltage Vcc and an output connected to the base of the transistor $Q_1$, a diode D1 having an anode connected to the base of the transistor $Q_1$ and a cathode connected to the output of the operational amplifier 10, a resistor $R_2$ connected between the base of the transistor $Q_2$ and the output of the operational amplifier 10, and a third PNP transistor $Q_3$ having an emitter connected to the high voltage Vcc, a collector connected to the base of the transistor $Q_2$ and a base connected to receive a control voltage Vc.

By controlling the base potential Vc of the transistor $Q_3$, the switch composed of the elements $I_1$, $D_1$, $R_2$ and $Q_3$ exerts a function equivalent to the switch $SW_1$ shown in FIG. 1. Namely, if the base potential Vc of the transistor $Q_3$ is controlled to turn off the transistor $Q_3$, the base potential of the transistor $Q_1$ is rendered higher than the base potential of the transistor $Q_2$, so that the transistor $Q_2$ is activated or turned on and the transistor $Q_1$ is turned off. In this condition, the input voltage Vin is converted into a current by the operational amplifier 10, the resistor $R_1$ and the transistor $Q_2$, so that the current $I_{O2}$ is outputted from the collector of the transistor $Q_2$. On the other hand, if the base potential Vc of the transistor $Q_3$ is controlled to turn on the transistor $Q_3$, the base potential of the transistor $Q_1$ is rendered lower than the base potential of the transistor $Q_2$, so that the transistor $Q_1$ is activated or turned on and the transistor $Q_2$ is turned off. In this condition, the input voltage Vin is converted into a current by the operational amplifier 10, the resistor $R_1$ and the transistor $Q_1$, so that the current $I_{O1}$ is outputted from the collector of the transistor $Q_1$.

Figure 3:
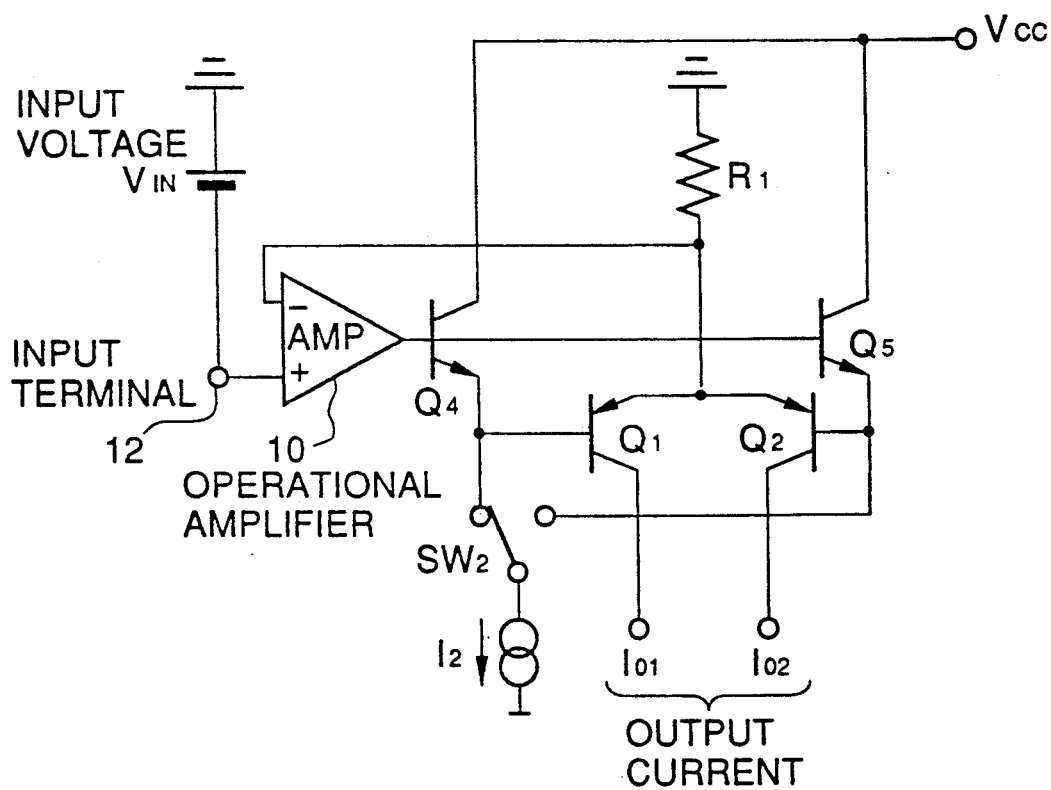
FIG. 3 is a circuit diagram of a second embodiment of the voltage-current converting circuit in accordance with the present invention.

Referring to FIG. 3, there is shown a circuit diagram of a second embodiment of the voltage-current converting circuit in accordance with the present invention. In FIG. 3, elements similar to those shown in FIG. 1 are given the same Reference Numerals and Letters, and explanation thereof will be omitted.

The embodiment shown in FIG. 3 is such that the operational amplifier 10 has two outputs which are selectively activated so as to switch from the current output transistor $Q_1$ to the current output transistor $Q_2$, and vice versa. This embodiment includes another pair of NPN transistors $Q_4$ and $Q_5$ having commonly connected bases connected to the output of the operational amplifier 10. A collector of each of the NPN transistors $Q_4$ and $Q_5$ is connected to the high voltage Vcc, and emitters of NPN transistors $Q_4$ and $Q_5$ are connected to the bases of the PNP transistors $Q_1$ and $Q_2$, respectively. In addition, the emitters of NPN transistors $Q_4$ and $Q_5$ are connected through a switch $SW_2$ to a current source $I_2$, so that either the emitter of NPN transistor $Q_4$ or the emitter of NPN transistor $Q_5$ is selected by the switch $SW_2$ and the selected one is connected to the current source $I_2$.

A basic operation of the voltage-current conversion in the circuit shown in FIG. 3 is the same as that of the shown in FIG. 1, and therefore, the relation between the input voltage Vin and the output currents $I_{O1}$ and $I_{O2}$ (the collector current of the transistors $Q_1$ and $Q_2$) can be expressed by the equations (2) and (3), similarly to the cases shown in FIGS. 1 and 2.

Now, if the switch $SW_2$ is connected to the emitter of the transistor $Q_4$, the transistor $Q_1$ and $Q_4$ are activated or turned on, and the transistor $Q_2$ and $Q_5$ are turned off. Therefore, the conversion current $I_{O1}$ is outputted from the collector of the transistor $Q_1$. If the switch $SW_2$ is connected to the emitter of the transistor $Q_5$, the transistor $Q_2$ and $Q_5$ are activated or turned on, and the transistor $Q_1$ and $Q_4$ are turned off. Therefore, the conversion current $I_{O2}$ is outputted from the collector of the transistor $Q_2$.

In the circuit shown in FIG. 3, since the output current load of the operational amplifier 10 is only the base current of the transistor $Q_4$ or $Q_5$, an (internal) output stage structure (not shown) of the operational amplifier 10 can be simplified or omitted.

As seen from the detailed description of the embodiments, the voltage-current converting circuit having a output switching function in accordance with the present invention is such that the same transistor functions not only as the output switching transistor but also as the voltage-current converting transistor. Therefore, the number of required elements can be decreased. In addition, since the number of elements through which the output current flows is decreased in comparison with the conventional voltage-current converting circuit, the degree of the voltage-current conversion precision can be elevated in comparison with the conventional one.

The invention has thus been shown and described with reference to the specific embodiments. However, it should be noted that the present invention is in no way limited to the details of the illustrated structures but changes and modifications may be made within the scope of the appended claims.

I claim:

1. A voltage-current converting circuit having an output switching function, comprising an operational amplifier having a non-inverting input connected to an input terminal, a resistor having one end connected to a reference potential line and the other end connected to an inverting input of the operational amplifier, first and second transistors of the same conduction type having commonly connected emitters connected to the inverting input of the operational amplifier, and an electronic switch means for alternatively supplying an output of the operational amplifier to either a base of the first transistor or a base of the second transistor so that a base-emitter path of the transistor having the base connected to the output of the operational amplifier through the electronic switch means forms a feedback loop starting from the output of the operational amplifier and returning to the inverting input of the operational amplifier, and a collector of the transistor receiving the output of the operational amplifier through the electronic switch means supplies a current output.

2. A voltage-current converting circuit claimed in claim 1 wherein the electronic switch means has an input connected to the output of the operational amplifier, a first output connected to the base of the first transistor and a second output connected to the base of the second transistor so that the output of the operational amplifier is alternatively connected either to the base of the first transistor or to the base of the second transistor.

3. A voltage-current converting circuit having an output switching function, comprising an operational amplifier having a non-inverting input connected to an input terminal, a resistor having one end connected to a reference potential line and the other end connected to an inverting input of the operational amplifier, first and second transistors of the same conduction type having commonly connected emitters connected to the inverting input of the operational amplifier, and an electronic switch means for alternatively supplying an output of the operational amplifier to either a base of the first transistor or a base of the second transistor, so that a collector of the transistor receiving the output of the operational amplifier through the electronic switch means supplies a current output, wherein the electronic switch means is constituted of a constant current source having an input connected to a high voltage and an output connected to the base of the first transistor, a diode having an anode connected to the base of the first transistor and a cathode connected to the output of the operational amplifier, a second resistor connected between the base of the second transistor and the output of the operational amplifier, and a third transistor having an emitter connected to the high voltage, a collector connected to the base of the second transistor and a base connected to receive a control voltage.

4. A voltage-current converting circuit claimed in claim 3 wherein the first, second and third transistor are of the PNP type.

5. A voltage-current converting circuit having an output switching function, comprising an operational amplifier having a non-inverting input connected to an input terminal, a resistor having one end connected to a reference potential line and the other connected to an inverting input of the operational amplifier, first and second transistors of the same conduction type having commonly connected emitters connected to the inverting input of the operational amplifier, and an electronic switch means for alternatively supplying an output of the operational amplifier to either a base of the first transistor or a base of the second transistor, so that a collector of the transistor receiving the output of the operational amplifier through the electronic switch means supplies a current output, wherein the electronic switch means includes third and fourth transistors having commonly connected bases connected to the output of the operational amplifier, a collector of each of the third and fourth transistors being connected to a high voltage, and emitters of the third and fourth transistors being connected to the bases of the first and second transistors, respectively, and a second switch for alternatively connecting the emitters of third and fourth transistors to a current source.

6. A voltage-current converting circuit claimed in claim 5 wherein the first and second transistor are of the PNP type and the third and fourth transistors are of the NPN type.

7. A voltage-current converting circuit having an output switching function, comprising an operational amplifier having a non-inverting input connected to an input terminal, a resistor having one end connected to a reference potential line and the other end connected to an inverting input of the operational amplifier, first and second transistors of the same conduction type having commonly connected emitters connected to the inverting input of the operational amplifier, third and fourth transistors having commonly connected bases connected to an output of the operational amplifier, a collector of each of the third and fourth transistors being connected to a high voltage, and emitters of the third and fourth transistors being connected to bases of the first and second transistors, respectively, and a switch for alternatively connecting the emitters of third and fourth transistors to a current source, so that a collector of the first or second transistor selected by the switch supplies a current output.

* * * * *